US011522511B2

(12) United States Patent
Carvalho et al.

(10) Patent No.: US 11,522,511 B2
(45) Date of Patent: Dec. 6, 2022

(54) DIGITALLY CONTROLLED MULTISTAGE COMBINER WITH A CASCADE OF COMBINERS

(71) Applicants: Paulo Carvalho, Lisbon (PT); Rui Dinis, Costa da Caparica (PT); Hugo Serra, Mem Martins (PT); João Oliveira, Parede (PT); Ricardo Madeira, Lisbon (PT); Pedro Morgado, Lisbon (PT)

(72) Inventors: Paulo Carvalho, Lisbon (PT); Rui Dinis, Costa da Caparica (PT); Hugo Serra, Mem Martins (PT); João Oliveira, Parede (PT); Ricardo Madeira, Lisbon (PT); Pedro Morgado, Lisbon (PT)

( * ) Notice: Subject to any disclaimer, the term of this patent is extended or adjusted under 35 U.S.C. 154(b) by 0 days.

(21) Appl. No.: 16/951,101

(22) Filed: Nov. 18, 2020

(65) Prior Publication Data

US 2022/0255522 A1 Aug. 11, 2022

(51) Int. Cl.
*H03G 3/30* (2006.01)
*H03F 3/60* (2006.01)

(52) U.S. Cl.
CPC .......... *H03G 3/3089* (2013.01); *H03F 3/604* (2013.01); *H03G 3/3068* (2013.01); *H03G 3/3078* (2013.01)

(58) Field of Classification Search
CPC .. H03G 3/3089; H03G 3/3068; H03G 3/3078; H03F 3/604
See application file for complete search history.

(56) References Cited

U.S. PATENT DOCUMENTS 7,729,675 B2 * 6/2010 Krone .................. H03G 3/3068
375/345
7,737,786 B2 * 6/2010 Plaze .................. H03D 7/1458
330/53

(Continued)

FOREIGN PATENT DOCUMENTS

CN 110710114 A * 1/2020 ........... H03F 1/0294
CN 114402569 A * 4/2022 ........... H03F 1/0294

(Continued)

OTHER PUBLICATIONS

T.S. Rappaport, et al., "Millimeter wave mobile communications for 5G cellular: it will work!," IEEE Access, vol. 1, pp. 335-349, May 2013. (Year: 2013).*

(Continued)

*Primary Examiner* — Berhanu Tadese

(57) ABSTRACT

Circuits and methods for using in parallel amplification and signal combining are described herein. A circuit uses a digitally controlled multistage cascade combiner, a digital phase and drive signal amplifier controller and a digital combiner controller circuit with N parallel signals with constant amplitudes belonging to an alphabet with M discrete values and discrete phases feeding it. The signals resulting from N power amplifiers (PAs) have also constant amplitudes belonging to an alphabet with N discrete values and discrete phases prior to being fed to the multistage combiner. A digital combiner controller circuit generates digital control information to activate, or deactivate, the outputs of the PAs, where a set of digital control signals generated in digital combiner controller are used to control sets of switches, where the signals can be activated at the combiner's inputs, according to their power and phase values. The digital control information ensures that only in-phase signals are combined in the active combiner stage and any difference among the inputs of the combiners is (Continued)

always minimized. Both digital combiner controller and digital drive signal amplifier controller, share information about the signals not to be fed to the multistage combiner, so that PAs drive signals can also be powered off under these circumstances. In provide high efficiency amplification the signal amplifiers employed before the combining stage may be of switched or current source type.

25 Claims, 10 Drawing Sheets

(56) References Cited

U.S. PATENT DOCUMENTS

| | | | | |
|---|---|---|---|---|
| 9,012,415 | B2 * | 4/2015 | Da Silva Correia | C08L 5/00 522/89 |
| 9,537,456 | B2 * | 1/2017 | Briffa | H03F 3/245 |
| 10,069,467 | B1 * | 9/2018 | Carvalho | H03F 1/0294 |
| 10,338,193 | B2 * | 7/2019 | Beko | G01S 5/12 |
| 10,511,359 | B2 * | 12/2019 | Carvalho | H04B 7/0434 |
| 10,597,316 | B2 * | 3/2020 | Gomes De Oliveira | C02F 9/00 |
| 11,095,253 | B2 * | 8/2021 | Carvalho | H03F 1/0294 |
| 11,211,900 | B2 * | 12/2021 | Carvalho | H03F 3/193 |
| 11,265,200 | B2 * | 3/2022 | Carvalho | H03F 3/211 |
| 2014/0350237 | A1 * | 11/2014 | da Silva Correia | A61L 27/54 536/114 |
| 2016/0164466 | A1 * | 6/2016 | Briffa | H03F 3/24 330/295 |
| 2021/0006207 | A1 * | 1/2021 | Carvalho | H03F 1/0211 |
| 2021/0359651 | A1 * | 11/2021 | De Araújo Borges Montezuma De Carvalho et al. | H03F 3/24 |

FOREIGN PATENT DOCUMENTS

| | | | | |
|---|---|---|---|---|
| CN | 114450888 | A * | 5/2022 | H03F 1/0211 |
| EP | 1611401 | A1 * | 1/2006 | F24J 2/0488 |
| EP | 2552406 | A1 * | 2/2013 | A61L 27/52 |
| TW | 201742370 | A * | 12/2017 | H03F 1/223 |
| WO | WO-9611149 | A1 * | 4/1996 | B65D 41/0414 |
| WO | WO-02075226 | A1 * | 9/2002 | F24J 2/02 |
| WO | WO-2004090437 | A1 * | 10/2004 | F24J 2/0488 |
| WO | WO-2009101518 | A2 * | 8/2009 | A61L 27/20 |
| WO | WO-2011119059 | A1 * | 9/2011 | A61L 27/52 |
| WO | WO-2011119059 | A4 * | 12/2011 | A61L 27/52 |
| WO | WO-2015183114 | A1 * | 12/2015 | H04L 25/03159 |
| WO | WO-2018160083 | A1 * | 9/2018 | H03F 1/0294 |
| WO | WO-2019074384 | A1 * | 4/2019 | H03F 1/0205 |
| WO | WO-2020076172 | A2 * | 4/2020 | H03F 1/0294 |
| WO | WO-2020076172 | A3 * | 7/2020 | H03F 1/0294 |
| WO | WO-2020177552 | A1 * | 9/2020 | |
| WO | WO-202261176 | A1 * | 12/2020 | H04L 25/03006 |
| WO | WO-2021069192 | A1 * | 4/2021 | G01D 3/036 |
| WO | WO-2021154106 | A1 * | 8/2021 | |
| WO | WO-2021221522 | A1 * | 11/2021 | H03F 1/0294 |
| WO | WO-2021221523 | A1 * | 11/2021 | H03F 1/0211 |
| WO | WO-2022108463 | A1 * | 5/2022 | |

OTHER PUBLICATIONS

S. Rangan, T.S. Rappaport, and E. Erkip, "Millimeter-wave cellular wireless networks: Potentials and challenges," Proc. IEEE, vol. 102, No. 3, pp. 366-385, Mar. 2014. (Year: 2014).*

D. Falconer, S. Ariyavisitakul, A. Benyamin-Seeyar, and B. Eidson, "Frequency domain equalization for single-carrier broadband wireless systems," IEEE Commun. Mag., vol. 4, No. 4, pp. 58-66, Apr. 2002. (Year: 2002).*

N. Benvenuto, R. Dinis, D. Falconer, and S. Tomasin, "Single carrier modulation with nonlinear frequency domain equalization: An idea whose time has come-Again," Proc. IEEE, vol. 98, n. 1, pp. 69-96, Jan. 2010. (Year: 2010).*

* cited by examiner

DIGITALLY CONTROLLED MULTISTAGE COMBINER WITH A CASCADE OF COMBINERS

BACKGROUND OF THE INVENTION

Field of the Invention

The present invention relates to lossless power combining for parallel amplifier structures for increased output power and amplification efficiency. More particularly, the present invention relates to digitally controlled multistage power combining structure with activation and deactivation of combiners, power amplifiers' (PAs) outputs and signal combiners inputs, according to the digital control information provided by the digital phase and drive signal amplifier controller and the digital combiner controller circuit that activates a set of switches, which combine sub-sets of PAs outputs signals with different power levels. Signals at the input of each combiner are selected according to a rule, based on the power and phase values, provided in the control information of the digital combiner controller circuit, to ensure a lossless signal combination in the multistage combiner and to guarantee the power level needed at the output.

DESCRIPTION OF RELATED ART

Present and future communications systems are only possible with high spectral and high-power efficiencies [1, 2]. This is especially important for high and very high bit rate communication systems where spectral efficiency is achieved by a single-carrier (SC) signal or multi-carrier (MC) modulations based on large constellations. However, high spectral efficiencies (i.e., large constellations), are also associated to signals with high envelope fluctuations and high peak-to-average power ratio (PAPR), which can compromise the power amplification efficiency of radio frequency (RF) transceivers [3]. Due to the tradeoff between linearity and efficiency in PAs, the more linear a PA is, the less power efficient it is. Due to signals' PAPR, the back off on PAs encompasses the ability to dynamically control a RF output power over a wide range and compromises the overall energy efficiency. This becomes particularly difficult on the amplification of wide-bandwidth signals with high PAPR, which is the case of common signals adopted in modern wireless communication systems, such as orthogonal frequency-division multiplexing (OFDM) [4], filter bank multi-carrier with offset quadrature amplitude modulation (FBMC-OQAM) [5], code division multiple access (CDMA) [3], wide band CDMA (W-CDMA), single-carrier with frequency-domain equalization (SC-FDE) [6, 7] and orthogonal frequency-division multiple access (OFDMA), are characterized by wide bandwidths associated to envelope fluctuations that lead to high PAPR values, which may compromise amplification efficiency [1, 7, 8, 9].

Modulated signals can be described by $s(t)=s_I(t)\cos(\omega_c t) - s_Q(t)\sin(\omega_c t)$, where $\omega_c = 2\pi f_c$ denotes the angular frequency, $f_c$ denotes the carrier frequency, and $s_I(t)$ and $s_Q(t)$ denote the in-phase and the quadrature component, respectively. The signal can also be described in terms of its complex envelope by $s(t)=\text{Re}\{\tilde{s}(t)e^{j\omega_c t}\}$, where $\tilde{s}(t)=s_I(t)+js_Q(t)$ denotes the complex envelope, with the signal envelope given by $e(t)=\sqrt{(s_I(t))^2+(s_Q(t))^2}$. When $e(t)$ is constant or quasi-constant over time, a signal is said to be a constant envelope signal. Time-varying envelope signal refers to a signal where $e(t)$ shows amplitude variations over time. Having both non-constant envelope and phase, $s(t)$ is said to be a time-varying complex envelope signal. The dynamic range (DR) of the envelope represents the range of values between which the signal's envelope varies.

In a time-varying envelope signal, the envelope values may assume any value within the DR of the envelope, which means that the number of possible values for the envelope will be infinite. Without discretization of the time-varying envelope, it is possible to obtain the decomposition into two or more constant magnitude phasors with appropriately specified phase shifts relative to a reference phasor using a technique called outphasing or linear amplification with nonlinear components (LINC) [10-12].

In the documents [10-12] LINCs are disclosed, where the input signal s(t) is decomposed into two constant envelope signals to be amplified separately by two highly efficient nonlinear amplifiers (e.g., switched amplifiers of class D and E). In conventional LINC, an input signal S(t) with a time-varying envelope is decomposed into two constant amplitude signals $S_1(t)$ and $S_2(t)$ which can be summed to provide a desired output signal $S_{out}(t)$. A time-varying envelope output signal is created as the sum of two constant-envelope signals $S_1(t)$ and $S_2(t)$ by outphasing the two constant envelope signals. Since the two signals $S_1(t)$ and $S_2(t)$ are of constant amplitude, they can be synthesized by PAs of classes D, E, F, E/F and current-mode D, Inverse F, $\phi$, etc. Combining the two constant amplitude outputs $S_1(t)$ and $S_2(t)$ in a power combining network enables the net output amplitude to be controlled via the relative phase of the two constituent components $S_1(t)$ and $S_2(t)$. This also means that LINC transmitter scheme is limited by the envelope characteristics of its input signal. Since the amplitude information of the band-limited signal is embedded in the phase of the LINC components, a highly fluctuating envelope produces a constant envelope LINC component with high phase content, which is what causes the LINC components' spectrum to spread.

A different approach to LINC is to quantize the envelope values using a finite set of quantizer values or symbols $\mathfrak{S} = \{s_0, s_1, \ldots, s_{N_{QL}-1}\}$, where $N_{QL}$ denotes the number of quantization levels, i.e. the size of the alphabet of quantization symbols. Let denote as $s(nT_s)=s_n$ the time-domain sample of the time-varying envelope signal at the sample instant $nT_s$ and $s_I(nT_s)=s_{nI}$ and $s_Q(nT_s)=s_{nQ}$ the corresponding in-phase and quadrature components. Representing the quantization symbols as a sum of complex components, the phases of the resulting signals belong to a discrete and limited alphabet $\xi=\{\phi_0, \phi_1, \ldots, \phi_M\}$. This makes possible to decompose the input signal's envelope into several bi-phase shift keying (BPSK), or quadrature phase shift keying (QPSK), or offset QPSK (OQPSK), or minimum shift keying (MSK), or Gaussian minimum shift keying (GMSK), or any other constant amplitude signals with discrete phases, in which the quantized values of the samples $s(t=nT_s)=s(n)$ for the complex envelope of a SC or MC signal are decomposed [13].

The problem related with parallel amplification, where all the PAs operate with constant outputs powers and with different (or equal) output power levels between them, is how the power combination is done. This is because typically high-efficiency PAs are highly sensitive to the load impedance, and their performance and efficiency can degrade due to interactions between the PAs. One possible approach is to use a lossless combiner, such as a Chireix non-isolating combiner or related methods [14]. Benefits of the Chireix combining technique include the fact that the combiner is ideally lossless, and that the real components of the effective load admittances seen by the individual PAs vary with outphasing (and power delivery) such that PA conduction losses can be reduced as output power reduces. Even though the reactive impedances of the combiner compensate the effective reactive loading on the PAs, due to interactions between them, efficiency may be affected. This can thus lead to loss of efficiency and PA degradation when operating over wide ranges.

Another approach is to combine the constant-amplitude signals using an isolating combiner. An isolating combiner provides constant resistive loading impedance to each PA, eliminating any interactions between the PAs. A consequence of combining different power levels is that not all power is delivered to the output. The power that is not delivered to the output must be delivered elsewhere, usually to an "isolation" resistor R which dissipates power in the form of heat. Thus, a portion of the total constant output power from the PAs is delivered to the sum port of the combiner, and the remainder is dissipated as heat in the isolation resistor. This leads to a rapid degradation of efficiency as output power is decreased, diminishing the attractiveness of this approach. This problem can be avoided by a digitally controlled multistage power combiner structure, where digital control information ensures that the output of each previous combiner in the cascade structure equals or approaches the next signal to be combined in the next combiner. Using the information provided by the digital phase and drive signal amplifier controller and the digital combiner controller circuit, it is possible to activate and deactivate combiners, the PA's outputs, and signal combiners inputs according to the combination rule provided by the digital combiner controller circuit that activate the switches needed to combine the sub-sets of PAs' output signals, that maximize the efficiency for each sampling interval. Signals at the input of each combiner are selected according to a rule based on the power and polarity, provided by the control information of the digital combiner controller circuit in order to ensure a lossless signal combination in the multistage combiner and to ensure the power level needed at the output.

It would, therefore, be desirable to provide a digitally controlled multistage power combining, where digital information generated in the quantization of the signal envelope can be employed to generate digital control information to control the PAs and the inputs of the combiners, for use in RF applications that overcome the loss and reactive loading problems of previous combining approaches, by providing ideally lossless power combining, enabling high average efficiency to be achieved even for structures with multiple amplifiers with different output powers.

INFORMATION DISCLOSURE STATEMENTS

Patents and publications relevant to the patentability of the instant claims, concerning a quantizer based amplification method.

[1] T. S. Rappaport, et al., "Millimeter wave mobile communications for 5G cellular: it will work!," *IEEE Access, vol.* 1, pp. 335-349, May 2013.

[2] S. Rangan, T. S. Rappaport, and E. Erkip, "Millimeter-wave cellular wireless networks: Potentials and challenges," *Proc. IEEE, vol.* 102, no. 3, pp. 366-385, March 2014.

[3] D. Falconer, S. Ariyavisitakul, A. Benyamin-Seeyar, and B. Eidson, "Frequency domain equalization for single-carrier broadband wireless systems," *IEEE Commun. Mag., vol.* 4, no. 4, pp. 58-66, April 2002.

[4] R. V. Nee and R. Prasad, OFDM for Wireless Multimedia Communications, 1st ed. Norwood, Mass., USA: Artech House, Inc., 2000.

[5] H. H. Chen, *The next generation of CDMA techniques*, John Wiley & Sons, 2007.

[6] N. Benvenuto, R. Dinis, D. Falconer, and S. Tomasin, "Single carrier modulation with nonlinear frequency domain equalization: An idea whose time has come—Again," *Proc. IEEE,* vol. 98, n. 1, pp. 69-96, January 2010.

[7] L. Zhang, L.-L. Kuang, Z.-Y. Ni, and J.-H. Lu, "Performance evaluation for OFDM and SC-FDE systems with high power amplifier," in *Proc. IET Int. Commun. Conf. Wireless Mobile Comput. (CCWMC)*, December 2009, pp. 348-352.

[8] R. Wolf, F. Ellinger, R. Eickhoff, "On the maximum efficiency of power amplifiers in OFDM broadcast systems with envelope following," in *Proc. Int. Conf. Mobile Lightw. Wireless Syst. (MobiLight)*, May 2010, pp. 160-170.

[9] O. Abel Gouba, Y. Louet, "Theoretical analysis of the trade-off between efficiency and linearity of the high power amplifier in OFDM context," in *Proc. Eur. Wireless Conf.*, April 2012, pp. 1-7.

[10] D. Cox, "Linear amplification with nonlinear components," *IEEE Trans. Commun.*, vol. 22, no. 12, pp. 1942-1945, December 1974.

[11] T. W. Barton, D. J. Perreault, "Theory and implementation of RF-input outphasing power amplification," *IEEE Trans. Microw, Theory Tech.*, vol. 63, no. 12, pp. 4273-4283, December 2015.

[12] D. Cox, "Linear amplification with nonlinear devices," U.S. Pat. No. 3,777,275 A, Dec. 4, 1973.

[13] D. J. Perreault, A. S. Jurkov, "Radio-frequency (RF) amplifier circuits and related techniques," U.S. Pat. No. 8,451,053 B2, May 28, 2013.

[14] P. Carvalho, R. Dinis, M. Beko, J. Guerreiro, and P. Viegas, "Quantized digital controlled amplification," U.S. Pat. No. 10,069,467, August 2018.

BRIEF SUMMARY OF THE INVENTION

The digitally controlled multistage combiner with a cascade of combiners system, uses a digital combiner controller circuit, a digital phase and drive signal amplifier controller, N signals with different amplitudes belonging to an alphabet with N discrete values feeding it, N amplifiers with different output powers in parallel and a maximum number of N−1 combiners in cascade with the inputs and outputs digitally controlled.

More particularly, the present invention relates to a digitally controlled multistage power combining structure with activation and deactivation of combiners, PA's outputs and inputs of combiners according to the digital control information provided by the digital phase and drive signal amplifier controller and the digital combiner controller circuit that activate a set of switches, that controls which sub-sets of PAs' output signals with different power levels are combined. Signals at the input of each combiner are selected according to a rule based on the power and phase values, that is provided in the control information of the digital combiner controller circuit in order to ensure an almost lossless signal combination in the multistage combiner and to ensure the power level needed at the output.

The samples of the N input signals are received by the digital phase and drive signal amplifier controller, where the amplitudes and phases are processed to generate a binary mapping table that is provided to the digital combiner controller circuit block. It is important to mention that the input N signals may be the decomposition result of a band limited information signal with time-varying envelope into N signal components or the N signals resulting from the decomposition of in-phase and quadrature components of one information band limited signal with time-varying envelope.

Based on the amplitudes and phases of the N input signals, the digital phase and drive signal amplifier controller generates the N drive signals for the N amplifiers and the digital control signals needed to control them. A binary mapping table is provided to the digital combiner controller circuit to generate the digital control signals needed to control the switches that activate and deactivate the outputs of the N amplifiers, the switches related with the activation and deactivation of the inputs of the N−1 cascade combiners and the switches that activate and deactivate the outputs of the N−1 cascade combiners. The digital combiner controller circuit also generates a table with information about the active combiners in the cascade combiner structure and the active input signals of the cascade combiners. This table is supplied to the digital phase and drive signal amplifier controller, to generate the digital signals that control the deactivation of drive signals of the amplifiers which are not feeding power to the active combiners, for each set of samples of the N input signals.

In some embodiments the binary mapping table can be one of the inputs received by the digital phase and drive signal amplifier controller block.

The N signal amplifiers employed before the combining stage to generate the RF input signals may be current source or switched amplifiers.

In accordance with the present concepts, systems and techniques described herein, a digitally controlled multistage combiner with a cascade of combiners system includes receiving the samples of N bandpass signals with constant envelope, N different amplitudes and discrete phases belonging to an alphabet of size 2. In another embodiment, this involves receiving the samples of N input RF signals with constant envelope with different amplitudes and discrete phases belonging to an alphabet of size 2. In another embodiment, this involves receiving N intermediate frequency (IF) signals with different amplitudes and discrete phases belonging to an alphabet with size 2. In another embodiment, this involves receiving the samples of N baseband signals with constant envelope and the digital phase and drive signal amplifier controller may also include a mixer to shift the signals to the desired frequency. The digitally controlled multistage combiner with a cascade of combiners system also includes receiving a clock signal according to the signal frequency of the N input signals, receiving a clock signal according to the sample frequency of the N input signals and receiving a clock signal in accordance with the frequency of the desired RF output signal. In some embodiments the input signals, before being processed, are sampled at the digital phase and drive signal amplifier controller block in accordance with the sampling frequency to generate the samples of the N input signals.

In accordance with the present concepts, systems and techniques described herein, a digitally controlled multistage combiner with a cascade of combiners system includes processing the phases and amplitudes of the N input signals in a digital combiner controller circuit, where the N amplitudes and phases are compared, to generate the digital signals that control the switches that activate and deactivate the outputs of the PAs, activate and deactivate the inputs of each combiner on the N−1 cascade combiners, and activate and deactivate the outputs of the cascade combiners and generate the phase shift information needed by the digital phase and drive signal amplifier controller to ensure that the signals combined in any combiner are in-phase. To generate the control information, the digital combiner controller circuit employs an algorithm that sequentially compares the phases and amplitudes (possible phases are 0 or $\pi$) of pairs of PAs' inputs signals. The phases of the PAs inputs signals are compared, starting with the pair with the highest power. If the signals have the same phase, they will both remain active and the algorithm moves on to the next comparison covering the second and third strongest signals. When they have different phases, the strongest output is deactivated, and the weaker phase assumes the phase of the strongest and the algorithm moves on to the next comparison covering the second and third strongest signals. The digital information about the deactivated signals, the deactivated combiners and the information to control the switches is stored in a look-up table (LUT). This process is recursively repeated until all input signals with different powers are compared.

In one embodiment, the digitally controlled multistage combiner with a cascade of combiners system uses N−1 stages of digitally controlled combiners in a cascade structure, with a maximum of N parallel signals feeding it. The signals from the PAs outputs may be fed to the combiners according with the digital control information provided by the digital combiner controller circuit. The phases of the N input signals are converted into several sets of digital control signals by a combiner control signal generator: one set of signals to control the switches that activate or deactivate the PAs outputs, a second set of control signals to control the switches that activate the bypass branches, a set of control signals to activate or deactivate the outputs of the combiners as inputs of another combiner in the cascade structure, another set of digital control signals to control the switches that deactivate the direct output of each combiner and another set of digital control signals that activate the switches that select signals in the active inputs of each combiner in the cascade structure.

In accordance with the present concepts, systems and techniques described herein, a digitally controlled multistage combiner with a cascade of combiners system includes processing the N input signals by multiplying these signals by a periodic pulse signal with the desired output signal frequency, individually amplifying each of one of the N input signals and processing the outputs of the N amplifiers, using the set of switch control signals to activate and deactivate PAs output signals and uses the active outputs of the amplifiers in sub-sets of signals with the same phase (or same polarity) as inputs of the active combiners in the multistage combiner structure.

In one embodiment, the digitally controlled multistage combiner with a cascade of combiners system includes processing the N RF input signals, using the set of digital control signals to provide these signals to in the inputs of the active combiners.

In accordance with the present concepts, systems and techniques described herein, a digitally controlled multistage combiner with a cascade of combiners system includes digital control information generated by the digital phase and drive signal amplifier controller block to change the phases of the input signals of each cascade combiner in order to ensure that all the active signals are in-phase at the input of each active combiner block in the cascade structure. The digital phase and drive signal amplifier controller block change the phases of the PA's input signals according to the information provided by the digital combiner controller circuit and feedback info about the phases of the PAs outputs.

In accordance with the present concepts, systems and techniques described herein, a digitally controlled multistage combiner with a cascade of combiners system includes a maximum of N−1 reactive or resistive combiners in a cascade having N or less active input ports, each of the N PAs having an input and an output, with the output of each PA coupled to a digitally controlled switch that selects the respective input port of the correspondent combiner in the cascade structure with N−1 combiners. It should be mentioned that as used herein, the term "reactive combiner" refers to a combiner provided from circuit components that store or transfer energy, including inductors, capacitors, transformers, and transmission lines, among other components.

In one embodiment, the digitally controlled multistage combiner with a cascade of combiners system includes N−1 reactive combiners having 2 input ports, and each one with the output port coupled to a set of digitally controlled switches that selects the respective input port of one of the next cascade combiners according to the digital control information generated by the digital combiner controller circuit block. According to the digital control signals and the signals selected as inputs for each combiner, the combiner of each cascade's stage may be modeled with circuit elements having reactive impedance characteristics in a RF range of interest, or as energy storage components, or energy transfer components, such that ideally there would be no loss. With this arrangement, the digitally controlled multistage combiner with a cascade of combiners system described herein, overcomes the loss and reactive loading problems of prior art. To achieve superior performance, it is necessary to consider the impedance characteristics of each portion of each combiner. It is important to mention that cascaded combiners from different stages may change the effective admittance characteristics seen at the combiner inputs, and the performance of the cascade combiner depends on all sections of the combiner from the inputs to the output. Consequently, to achieve high performance, the reactance values (and similar characteristics) of all elements in the multistage combiner are taken having into account the digital control signals and the input signals applied to each combiner.

In accordance with a further aspect of the present concepts, systems and techniques described herein, a digitally controlled multistage combiner with a cascade of combiners system includes a multistage combiner with a plurality of stages of combiner elements having a number of input ports that depend on the stage where each combiner is placed. In each stage, each combiner has one or more reactive elements, each one having a specified reactance at an operating frequency, or a specified range of reactance values over an operating frequency range. In some embodiments, there are N−1 cascade combiners with two inputs and two bypass branches, and all combiners have similar internal structure. In other embodiments, some of the N−1 combiners may also be implemented as a cascade structure of combiners to minimize combination losses and may have resistive or reactive elements with reactance's magnitude specified for the operating frequency. In some embodiments, the reactive elements within a stage may have the same reactance magnitude at the operating frequency while reactive elements in different stages may have a different reactance magnitude at the operating frequency. In another embodiment the cascade structure of combiners has N−2 combiners, where N−3 combiners have two inputs and one combiner has 3 inputs. In one embodiment the cascade structure has a cascade of two reactive combiners each one with N/2 inputs that can be activated or deactivated according with the digital control signals. In another embodiment the cascade structure of N−1 combiners can be replaced by one reactive combiner with N inputs that can be activated or deactivated by digital control signals.

In one embodiment, the cascade combiners include non-isolating combiners. In another embodiment, the cascade combiners include isolating combiners, such as Wilkinson combiners.

In one embodiment, the cascade of power combiners comprises isolating combiners such as Wilkinson combiners and transformer-based power combiners.

Embodiments of the invention can be implemented with analog and/or digital controls. The invention can be implemented with analog components or with a combination of analog components and digital components.

Additional features and advantages of the invention will be set forth in the description that follows. Yet, further features and advantages will be apparent to a person skilled in the art based on the description set forth herein or may be learned by practice of the invention. It is to be understood that both the following detailed description is exemplary and explanatory and is intended to provide further explanation of embodiments of the invention as claimed.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF DRAWINGS

The various aspects of the embodiments disclosed here, including features and advantages of the present invention outlined above, are further described below in the detailed description in conjunction with the drawings, where reference numerals refer to elements throughout, in which.

DETAILED DESCRIPTION OF THE INVENTION

In one embodiment, herein called digitally controlled stair combiner with multiple similar combiners (DCSMSC), N input constituent signals with constant amplitude and two discrete phases, are individually amplified and combined according to the phase relationship between constituent signals. In the DCSMSC embodiment the N input signals can be bandpass signals, RF signals or IF signals. In another embodiment this involves receiving the time samples of the N desired IF input signals or the time samples of N RF input signals. In another embodiment this involves receiving the time samples of the N baseband input signals.

Figure 1:
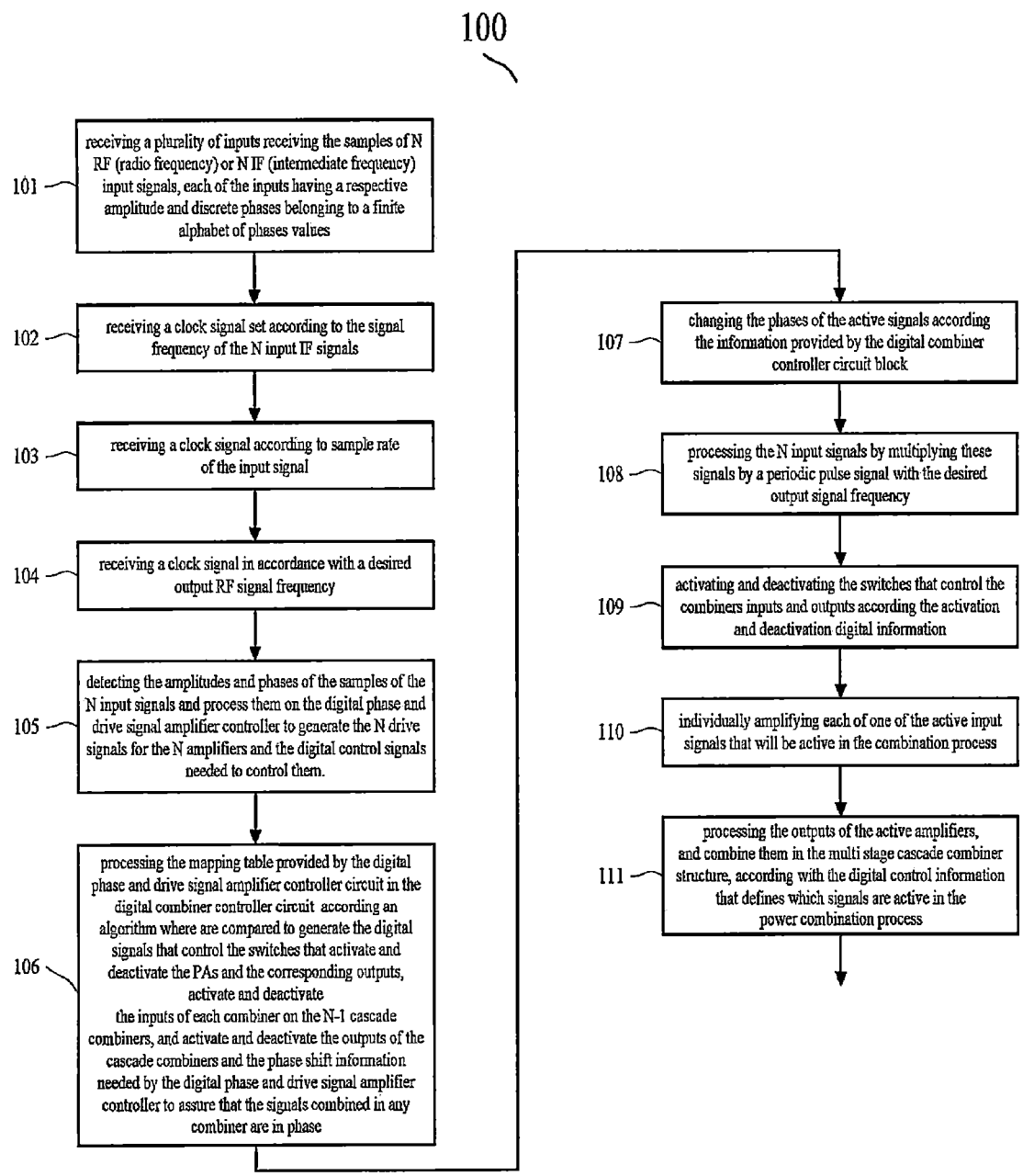
FIG. 1 is a process flowchart embodiment for digitally controlled multistage combiner with a cascade of combiners method with N IF input signals.

The operation of the DCSMSC embodiment shall be described further with reference to the flowchart of FIG. 1. The process starts at step 101, which includes receiving the samples of N IF signals or the samples of N RF signals with constant amplitudes and discrete phases belonging to an alphabet with size 2. In another embodiment this involves receiving the desired IF signals and a sampling process should be performed by a sampling circuit or a sample and hold (S/H) circuit to generate the samples of the input signals. In another embodiment this involves receiving the envelope samples of the N input signals.

Step 102 includes receiving a clock signal set according to the signal frequency of the N input IF signals.

Step 103 includes receiving a clock signal according to the sample rate of the input signal. It is important to mention that, as understood by a person skilled in the art, the sample rate may vary according to the bandwidth of the input signal and the desired time resolution of the sampling process.

Step 104 includes receiving a clock signal in accordance with a desired output RF signal frequency.

Step 105 includes detecting the amplitudes and phases of the samples of the N input signals and process them on the digital phase and drive signal amplifier controller to generate the N drive signals for the N amplifiers and the digital control signals needed to control them. A binary mapping table is provided to the digital combiner controller circuit to generate the digital control signals needed to control the switches that activate and deactivate the outputs of the N amplifiers, control the switches related with the activation and deactivation of inputs of the cascade combiners and the switches that activate and deactivate the outputs of the cascade combiners.

Step 106 includes processing the mapping table provided by the digital phase and drive signal amplifier controller circuit in the digital combiner controller circuit according to an algorithm where the phases and amplitudes of the PAs inputs are compared to generate the digital control signals that control the switches that activate and deactivate the PAs and the PAs' outputs, activate and deactivate the inputs and bypasses of each combiner on the cascade combiners, and activate and deactivate the outputs of the cascade combiners and the phase shift information needed by the digital phase and drive signal amplifier controller to ensure that the signals combined in any combiner are in-phase. To generate the control information the digital combiner controller circuit employs an algorithm that compares the phases and polarities (possible phases are 0 or $\pi$) of pairs of PAs' inputs signals. The phases and amplitudes of the signals are compared, starting with the pair with the two highest powers. If the signals have the same phase, they will both remain active and the algorithm moves on to the next comparison covering the second and third strongest signals. When they have different phases, the strongest is deactivated and the weaker signal assumes the phase of the strongest and the algorithm moves on to the next comparison, covering the second and third strongest signals. The activation and deactivation digital information, which includes information about the deactivated signals, the deactivated combiners and the information to control the switches, is stored in a LUT. This process is repeated until all input signals with different powers are recursively compared. The information about activation and deactivation is also delivered to the digital phase and drive signal amplifier controller circuit in order to activate or deactivate drive signals and to change signal phases according to the control information generated by the algorithm. As understood by a person skilled in the art based on the teaching herein, the steps 105 and 106 can be performed by a single block using a comparator and 3 LUTs with the corresponding bits for the discrete values of the phase amplitudes and the digital control signals that turn on or off the switches of the cascade combiner structure.

Step 107 includes changing the phases of the active signals according to the information provided by the digital combiner controller circuit block.

Step 108 includes processing the N input signals by multiplying these signals by a periodic pulse signal with the desired frequency of the output signal.

Step 109 includes activating and deactivating the switches that control the combiners inputs, bypasses, and outputs according to the activation and deactivation digital information.

Step 110 includes individually amplifying each of the active input signals that will be active in the combination process.

Step 111 includes processing the outputs of the active amplifiers and combining them in the multistage cascade combiner structure, according to the digital control information that defines which signals are active in the power combination process.

This process is repeated for the several sampling time intervals associated with the successive time samples of the N input signals.

In some embodiments all the successive samples of the N input signals of a data block are processed previously to the start of the amplification and power combination. In another embodiment the amplification and combination start after the computation of the digital control signals for activation and deactivation of signals and combiners in the combination process for a sub-set of samples of the N input signals.

Figure 2:
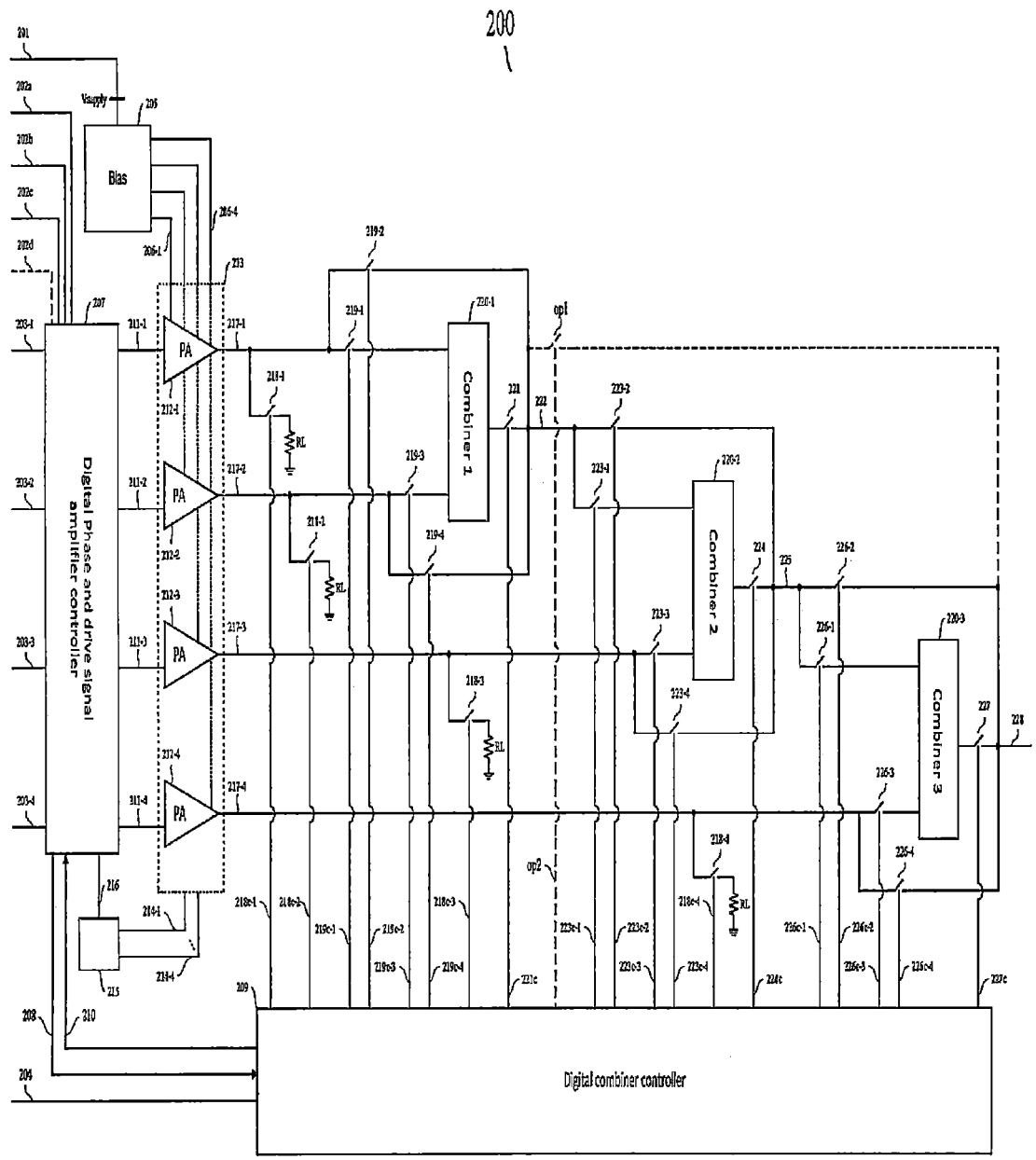
FIG. 2 is a block diagram that illustrates an exemplary embodiment of a digitally controlled multistage combiner with a cascade of combiners apparatus for implementing the digitally controlled multistage combiner with a cascade of combiners method with IF input signals.

Block diagram 200 of FIG. 2 is an example that illustrates an exemplary embodiment implementing the process flowchart 100 of FIG. 1 with the input signals' phases belonging to an alphabet with M=2 possible values, that may assume 0 or π, and N=4 input signals. Optional components are represented with dotted lines. In the example of FIG. 2, optional components are illustrated with dashed lines. In the example of FIG. 2, it is assumed N=4 only for illustration purposes and not limitation. In other embodiments additional components may be optional, and the number of input signals N can be higher or lower than 4. In this example a clock reference signal 202a with the sampling frequency and a channel clock 202b for the RF signal, a clock signal 202c referring to the IF of the N input IF signals and the samples of N IF signals 203-{1, . . . ,N}, are received as inputs. In another embodiment the N inputs can be N IF signals 203-{1, . . . ,N} which are sampled in block 207, before being processed. In another embodiment signals 203-{1, . . . ,N} can be baseband signals, and block 207 can also include a mixer to translate the signals to the IF. It can be understood by a person skilled in the art that the choice of the clock reference signals is made according to the bandwidth of the input signals and the desired frequency of the input signal. It is noted that one alphabet with M=2 with phases of 0 or π, according to the polarity, is employed in this embodiment only for purposes of illustration, and not limitation. It is also noted that N=4 input signals and N−1=3 cascade combiners are employed in this embodiment only for purposes of illustration, and not limitation. The scope of the invention covers the use of other discrete phase alphabet values and other numbers of input signals and cascade combiners, and the implementation of such variations will be apparent to persons skilled in the art based on the teachings contained herein. The input signal 204 is a clock reference signal with the sampling frequency for the digital combiner controller circuit 209, and the sampling frequency is the same of clock reference signal 202a.

The digital phase and drive signal amplifier controller 207 processes the samples of the N received signals according to the clock signals 202a, 202b and 202c and maps the discrete values of amplitude and phases of the N input signals into a binary mapping table that may be stored in a LUT. This information is also used to generate the N drive signals for the N amplifiers and the digital control signals needed to control them. The binary mapping table is provided by 208 to the digital combiner controller circuit 209 that uses this information to generate the digital control signals needed to control the switches that activate and deactivate the outputs of the N amplifiers, the switches related with the activation and deactivation of inputs of the cascade combiners and the switches that activate and deactivate the outputs of the cascade combiners. Input 202d is optional and carries the quantization bits related with the quantization of a signal into N baseband signals or N IF signals or N RF signals whose samples are the input signals.

In another embodiment common clock signals 202a, 202b and 202c and digital control signals 210 are used to ensure that the outputs of cascade combiners 220-{1, . . . ,N−1} are time and frequency aligned. These signals can be also used by the digital phase and drive signal amplifier controller block 215 together with feedback signals 214-{1, . . . ,N} to correct phases mismatches at the PAs outputs. Signal 216 is the PAs' input phase and drive control generated by the digital phase and drive signal amplifier controller block 215, based on feedback signals 214-{1, . . . ,N} that provide information about the phases and amplitudes of PAs outputs.

The N=4 input signals 211-{1, . . . ,N} of the PAs 212-{1, . . . ,N} are obtained by multiplying in 207 the input signals 203-{1, . . . ,N} by a pulse periodic signal with the desired frequency for the drive signal of each PA. The PAs 212-{1, . . . ,N} of the amplification stage 213 may be of current source or switching PAs, according to the requirements of the system, where the digitally controlled multistage combiner with a cascade of combiners system is deployed.

Still referring to FIG. 2, the mapping table information 208 is provided by the digital phase and drive signal amplifier controller circuit 207 to the digital combiner controller circuit 209 that generates digital control information to control a set of activation and deactivation switches, and uses input signal 204 with a time clock reference for the sampling rate. The digital combiner controller circuit 209 uses an algorithm where the phases and polarities of the PA's inputs are compared to generate the digital signals that control the switches that activate and deactivate the outputs of PAs, activate and deactivate the inputs of each combiner, and activate and deactivate the outputs of the cascade combiners and generate the phase shift information needed by the digital phase and drive signal amplifier controller 207 to ensure that the combined signals in any combiner are in-phase. To generate the control information, the digital combiner controller circuit 209 employs an algorithm that starts doing a comparison of the polarities (possible phases are 0 or π) of a pair of PAs' outputs signals. The phases and amplitudes of the signals are compared, starting with the pair of higher power signals. If the signals have the same phase, they will both remain active and the algorithm moves on to the next comparison covering the second and third strongest signals. When they have different phases, the strongest is deactivated and the weaker signal assumes the phase of the strongest and the algorithm moves on to the next comparison covering the second and third strongest signals. The activation and deactivation digital information includes information about the deactivated signals, the deactivated combiners, and the info to control the switches, is stored in a LUT. This process is recursively repeated until all input signals with different powers are compared. The information about phase alignment, activation and deactivation 210 is also delivered to the digital phase and drive signal amplifier controller circuit 207 in order to activate or deactivate drive signals and change signal phases according to the control information generated by the algorithm.

The digital control signals includes the set of digital control signals 218c-{1, . . . ,N}, used to control the switches 218-{1, . . . ,N} and the sets of digital control signals 219c-{1, . . . ,4}, 223c-{1, . . . ,4} and 226c-{1, . . . ,4}, used to control the switches 219-{1, . . . ,4}, 223-{1, . . . ,4} and 226-{1, . . . ,4} respectively, that activate or deactivate the outputs of the amplifiers 217-{1, . . . ,N} as inputs of the cascade combiners 220-{1, . . . ,N−1} and activate or deactivate the switches 219-{2,4}, 223-{2,4} and 226-{2,4} that control the bypass at each combiner 220-{1, . . . ,N−1} respectively. Another set of digital control signals 221c, 224c, and 227c control the switches 221, 224, and 227 that activate or deactivate the outputs of the cascade combiners 220-{1, . . . ,N−1}. 222 is the output signal that results from bypass or signal combining of first cascade combiner stage. 225 is the output signal that results from bypass or signal combining of first cascade combiner stage.

The activation of outputs of cascade combiners outputs 220-{1, . . . ,N−1} are controlled by the digital control signals 221c, 224c and 227c, respectively. In combiner 220-1 the bypass switches 219-2 and 219-4 are controlled by digital control signals 219c-2 and 219c-4, respectively. In combiner 220-2 the bypass switches 223-2 and 223-4 are controlled by digital control signals 223c-2 and 223c-4, respectively. Also, for the combiner 220-3 the bypass switches 226-2 and 226-4 are controlled by digital control signals 226c-2 and 226c-4, respectively.

It is noted that only when all PAs outputs signals 217-{1, . . . ,N} are in-phase, all cascade combiners outputs are active and 228 corresponds to the sum of all combiners outputs 220-{1, . . . ,N−1}. When PAs outputs signals 217-{1, . . . ,N} have different polarities or phases, only part of the PAs are active and only part of the cascade combiners are active. It is important to mention that a bandpass filter can be placed after the output of cascade of combiners to perform the spectral shaping of said desired output signal. Optional switch op1 connects the output of the first cascade combiner stage to the output of cascaded combiner structure and is controlled by the control signal op2. In embodiments with N cascade combiners, N−2 combiners have these optional components to control the direct connection to the output of the cascaded combiner structure.

The cascade combiners 220-{1, . . . ,N−1}, may use well known combining techniques such as active combiners or other techniques such as Wilkinson, zero phase delay combiner, a combination of zero phase delay splitters followed by Wilkinson or zero phase delay combiners, hybrid or transformers or LC matching for a minimal power loss. According to the digital control signals provided by the digital combiner controller circuit 209 and the signals selected as inputs for each combiner, the impedances of combiners in each stage may be modeled with circuit elements having reactive impedance characteristics or as energy storage components or energy transfer components. To achieve high performance, the reactance values and resistive values of all elements in the multistage combiner are taken having into account the digital control signals and the input signals applied to each combiner. In some embodiments each one of the cascade combiners can be implemented as a cascade of splitters followed by a cascade of combiners that may be active or passive ones.

It is noted that 2 discrete phases with values of 0 or $\pi$, and N=4 input signals with different amplitudes are employed in this embodiment only for purposes of illustration, and not limitation. The scope of the invention covers use of other numbers of discrete phases with different values, and implementation of such variations will be apparent to persons skilled in the art based on the teachings contained herein.

It is noted that outputs of PAs 217-{1, . . . ,N}, are P, P, 2P and 4P, with the first two amplifiers with the same output power being employed in this embodiment only for purposes of illustration, and not limitation. Ratios between output powers of 2 such as P, 2P, 4P and 8P or ratios of 4 such as P, 4P, 16P and 64P or other ratios between powers can be also adopted. The scope of the invention covers the use of other power ratios between amplifiers, and implementation of such variations will be apparent to persons skilled in the art based on the teachings contained herein. It is important to mention that an output power ratio of 2, and first two amplifiers with same output power, ensures that the output of the previous combiner equals the power of the next PA in the next combiner of the cascade structure.

In another embodiment a bias circuit 205 can be employed to provide supply and bias signals 206-{1, . . . ,N} to the PAs 212-{1, . . . ,N}, according to the power control signal 201 received as input.

According to digital control signals and the signals selected as inputs for each combiner, the impedances of combiners in each stage may be modeled with circuit elements having reactive impedance characteristics or as energy storage components or energy transfer components. To achieve high performance, the reactance and resistive values of all elements in the multistage combiner are taken having into account the digital control signals and the input signals applied to each combiner.

In another embodiment, common clock signals 202a, 202b and 202c are used to ensure that the outputs of N−1 cascade combiners 220-{1, . . . ,N−1} are time and frequency aligned.

Figure 3:
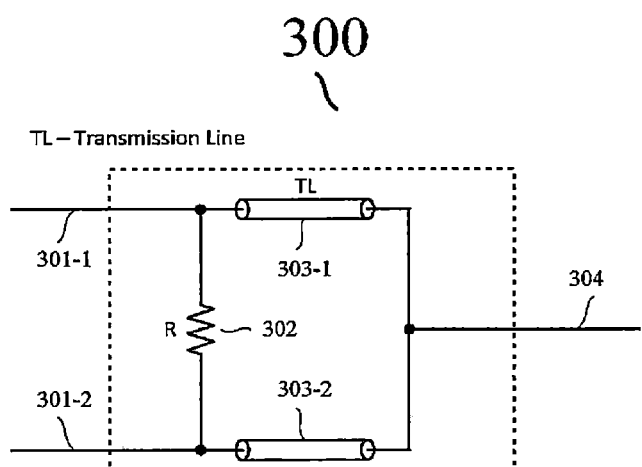
FIG. 3 is a block diagram that illustrates an exemplary embodiment of a combiner that can be employed in the digitally controlled lossless multistage combiner with multiple cascade combiners.

Block diagram 300 of FIG. 3 is an example that illustrates an exemplary embodiment of a combiner that can be employed in combiners 220-{1, . . . ,N−1} of embodiment of FIG. 2. Branches 301-1 and 301-2 are the inputs of the combiner. Resistance 302 represents an isolation resistance between the two inputs. 303-1 and 303-2 may be transmission lines (conductors) with the same length. The outputs of 303-1 and 303-2 are combined in the output signal 304.

Figure 4:
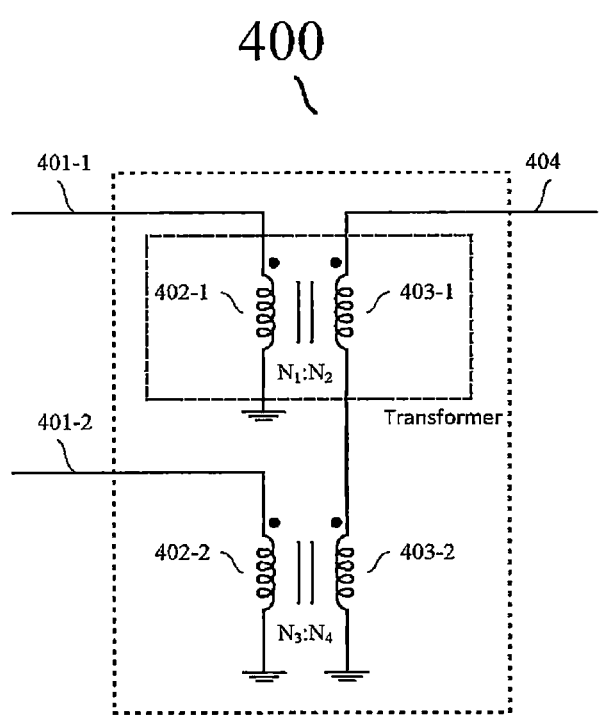
FIG. 4 is a block diagram that illustrates an exemplary embodiment of a reactive combiner in a digitally controlled multistage combiner with multiple cascade combiners.

Block diagram 400 of FIG. 4 is an example that illustrates an exemplary embodiment of a reactive combiner that can be employed in combiners 220-{1, . . . ,N−1} of embodiment of FIG. 2. Signals 401-1 and 401-2 are the two inputs of the combiner, with each one connected to the corresponding primary circuit winding 402-1 and 402-2 of the inductive combiner. 403-1 and 403-2 are the secondary windings that ensure that signals 401-1 and 401-2 are summed to generate the output signal 404. In other embodiments a reactive combiner may have more than two inputs.

Figure 5:
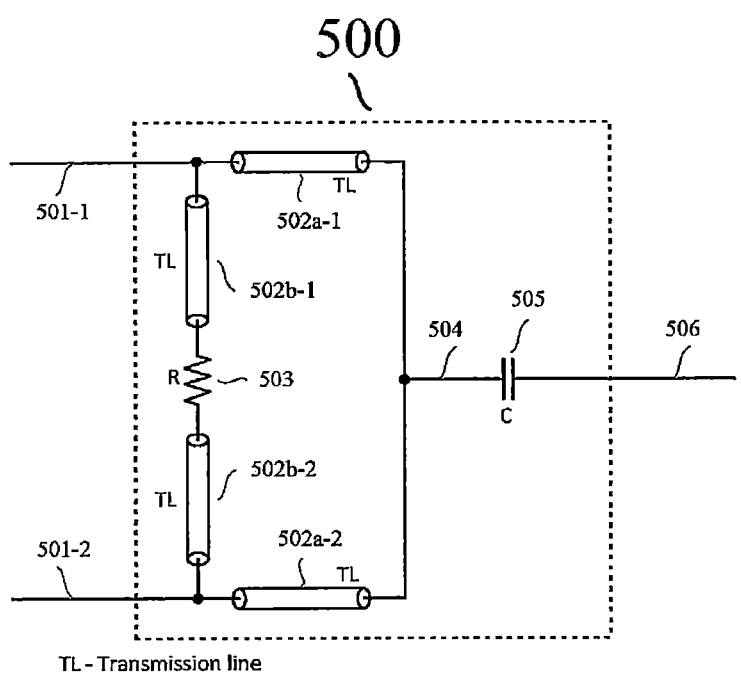
FIG. 5 is a block diagram that illustrates an exemplary embodiment of a zero phase delay combiner that can be employed in the digitally controlled multistage combiner with multiple cascade combiners.

Block diagram 500 of FIG. 5 is an example that illustrates an exemplary embodiment of a zero phase delay combiner that can be employed in combiners 220-{1, . . . ,N−1} of embodiment of FIG. 2. Signals 501-1 and 501-2 are the two inputs of the zero phase delay combiner. 502a-{1,2} and 502b-{1,2} are transmission lines (each with a specific length) and 503 is an isolation resistance. The outputs of 502a-1 and 502a-2 are combined in 504. The capacitor 505 together with the transmission lines 502a-{1, . . . ,2} and 502b-{1, . . . ,2} ensures that the output signal 506 is in-phase with the input signals 501-1 and 501-2. In another embodiment transmission lines can be replaced by inductive and capacitive components.

Figure 6A:
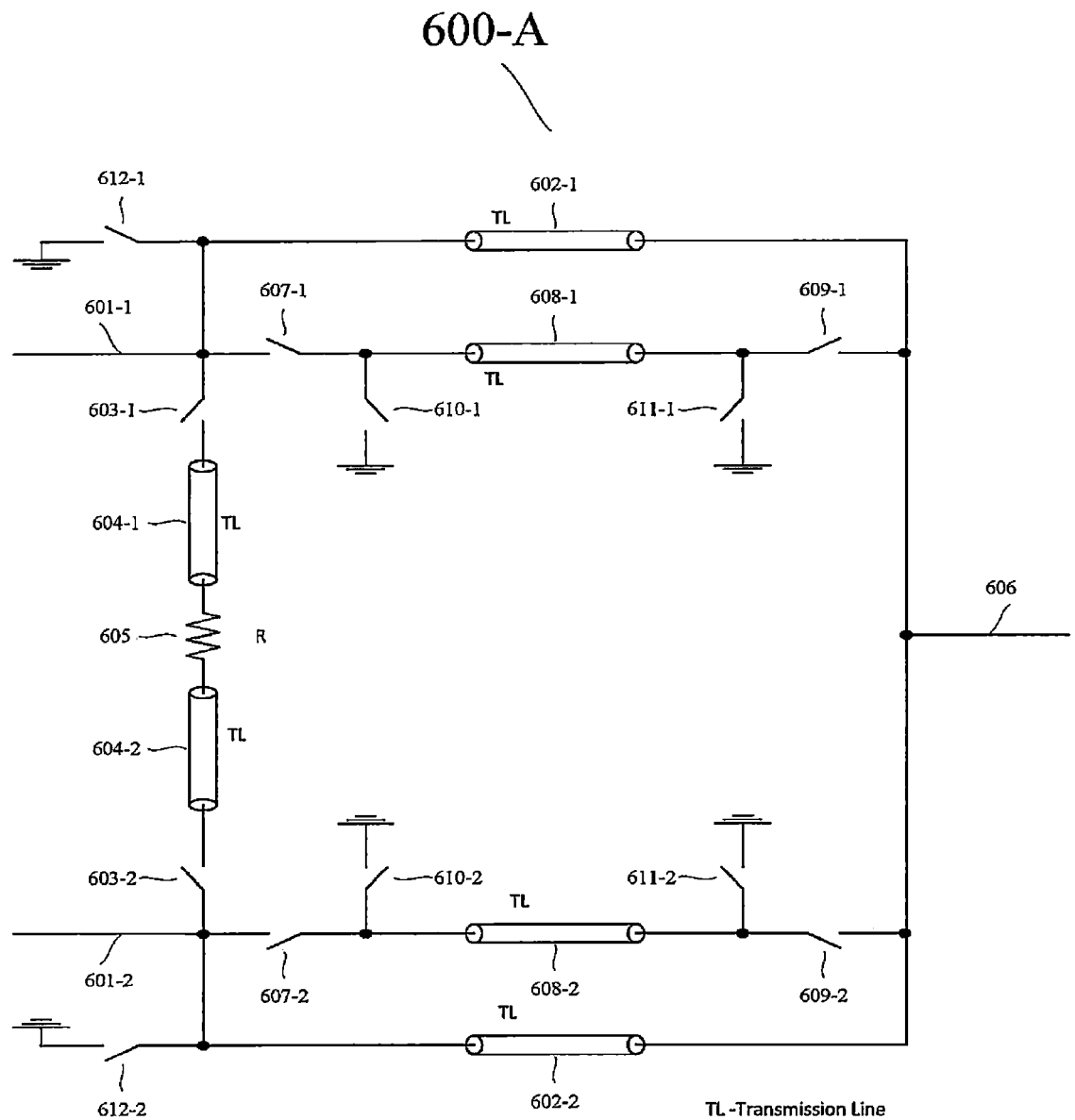
FIG. 6A is a block diagram that illustrates an exemplary embodiment of combiner with bypasses that can be employed in the implementation of a digitally controlled multistage combiner with multiple cascade combiners.

Block diagram 600-A of FIG. 6A is an example that illustrates an exemplary embodiment of a combiner with bypasses that can be employed in combiners 220-{1, . . . ,N−1} with bypasses in embodiment of FIG. 2. Signals 601-1 and 601-2 are the two inputs of the combiner. When the circuit is operating as a combiner switches 603-{1,2}, 610-{1,2} and 611-{1,2} are on (i.e. closed) and switches 607-{1,4}, 609-{1,2} and 612-{1,2} are open. Transmission lines 604-{1,2} (each with a specific length) ensure that signals are in-phase throughout the compensation of the delays introduced by switches 603-{1,2}. Also, 602-{1,2} are transmission lines (each with a specific length) that ensure that signals are in-phase at the combiner's output 606. When the circuit is operating in bypass mode switches 607-1, 609-1, 610-2, 611-2 and 612-2 are on, and the switches 603-{1,2}, 607-2, 609-2, 610-1, 611-1 and 612-1 are open. When bypasses are activated, the transmission lines 608-{1,2} are needed to reduce the input and the output impedance to 50 Ohm. Switches 612-{1,2} increase the impedance that the output sees for the branch that is not being used, taking advantage of the high impedance associated to a transmission line with ¼ wavelength connected to ground. In other embodiments switches 610-{1,2} and 611-{1,2} are optional. In another embodiment transmission lines can be replaced by inductive and capacitive components.

Figure 6B:
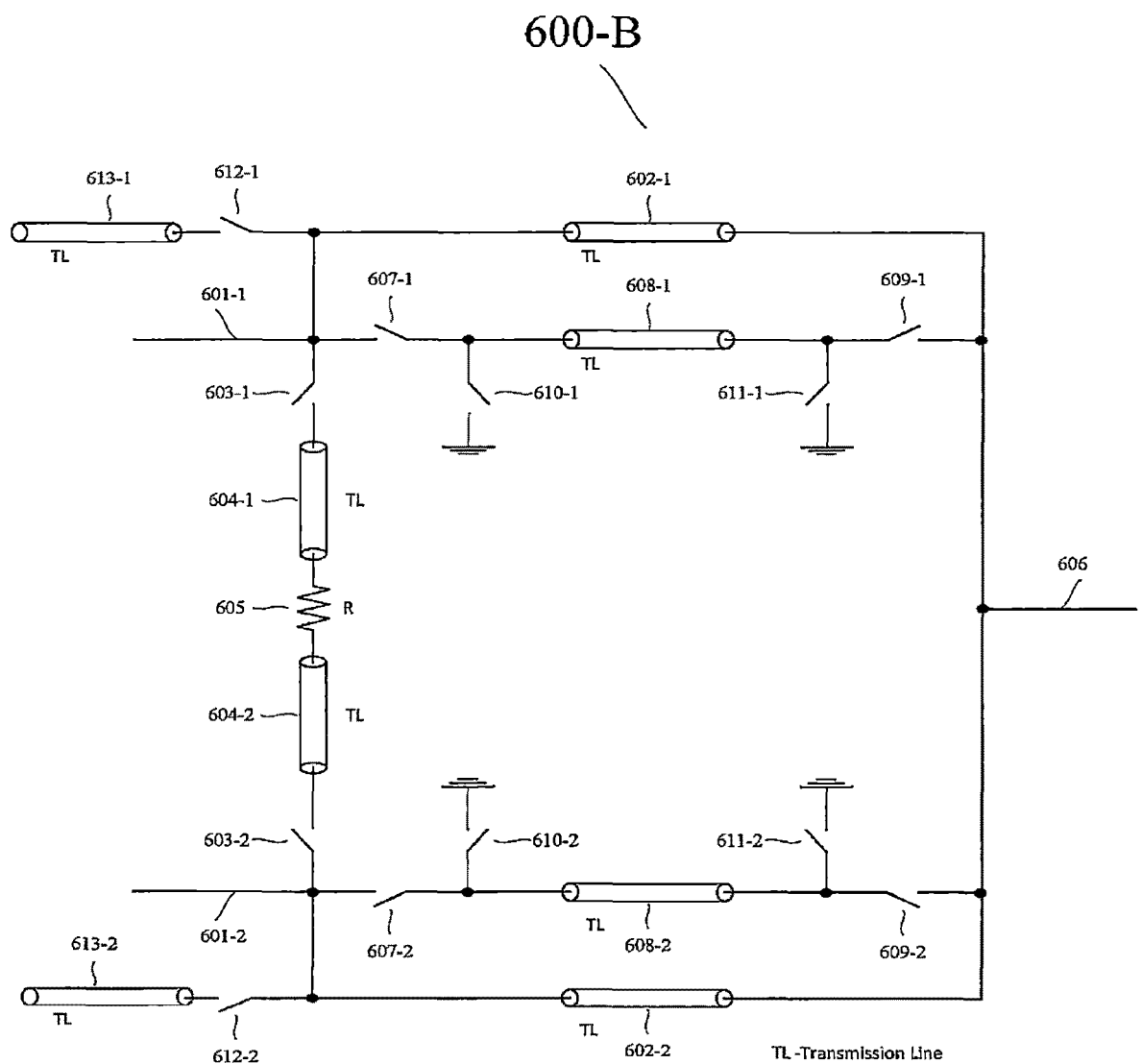
FIG. 6B is a block diagram that illustrates an exemplary embodiment of combiner with bypasses that can be employed in the implementation of a digitally controlled multistage combiner with multiple cascade combiners with transmission lines in open circuit to increase impedance.

Block diagram 600-B of FIG. 6B is an example that illustrates another embodiment of a combiner with bypasses that can be employed in combiners 220-{1, . . . ,N−1} and bypasses of embodiment of FIG. 2. Signals 601-1 and 601-2 are the inputs of the combiner. When the circuit is operating as a combiner switches 603-{1,2}, 610-{1,2} and 611-{1,2} are on and switches 607-{1,2}, 609-{1,2} and 612-{1,2} are open. Transmission lines 604-{1,2} (each with a specific length) assure that signals are in-phase throughout the compensation of the delays introduced by switches 603-{1, 2}. Transmission lines 602-{1,2} (each with a specific length) are used to ensure that signals are in-phase at the combiner's output 606. When the circuit is operating in bypass mode switches 607-1, 609-1, 610-2, 611-2 and 612-2 are on, and the switches 603-{1,2}, 607-2, 609-2, 610-1, 611-1 and 612-1 are open. When bypasses are activated, the transmission lines 608-{1,2} are needed to reduce the input and the output impedance to 50 Ohm. Switches 612-{1,2} and transmission lines 613-{1,2} increase the impedance that the output sees for the branch that is not being used, taking advantage of the high impedance associated to a transmission line with ½ wavelength in open circuit. In other embodiments switches 610-{1,2} and 611-{1,2} are optional, and transmission lines can be replaced by inductive and capacitive components.

Figure 7:
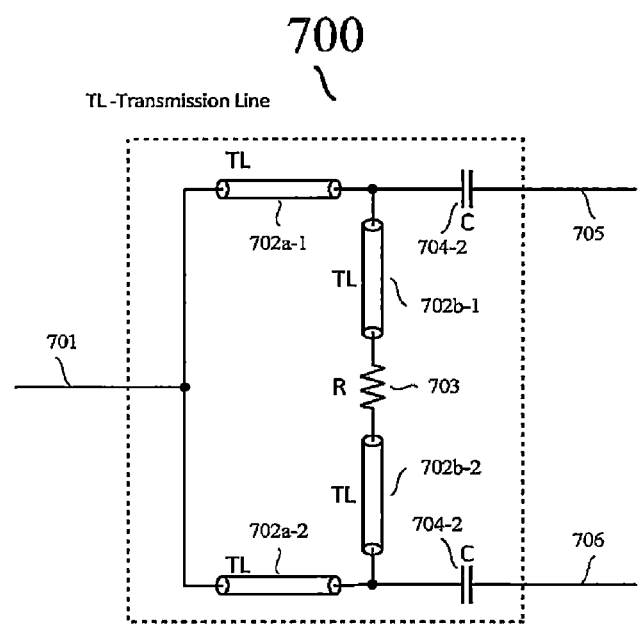
FIG. 7 is a block diagram that illustrates an exemplary embodiment of a zero phase delay splitter that can be employed in the implementation of a combiner as a cascade of splitters and combiners in the digitally controlled lossless multistage combiner with multiple cascade combiners.

Block diagram 700 of FIG. 7 is an example that illustrates an exemplary embodiment of a zero phase delay splitter that can be employed in combiners 220-{1, . . . ,N−1} of embodiment of FIG. 2. The power of signal 701 is split into two signals, 705 and 706, each with half of the power of the input signal. 702a-{1,2} and 702b-{1,2} are transmission lines (each with a specific length) and 703 is an isolation resistance. 704-1 and 704-2 are capacitors that assure that signal 705 and 706 are in-phase with the input signal 701. In another embodiment transmission lines can be replaced by inductive and capacitive components.

Figure 8:
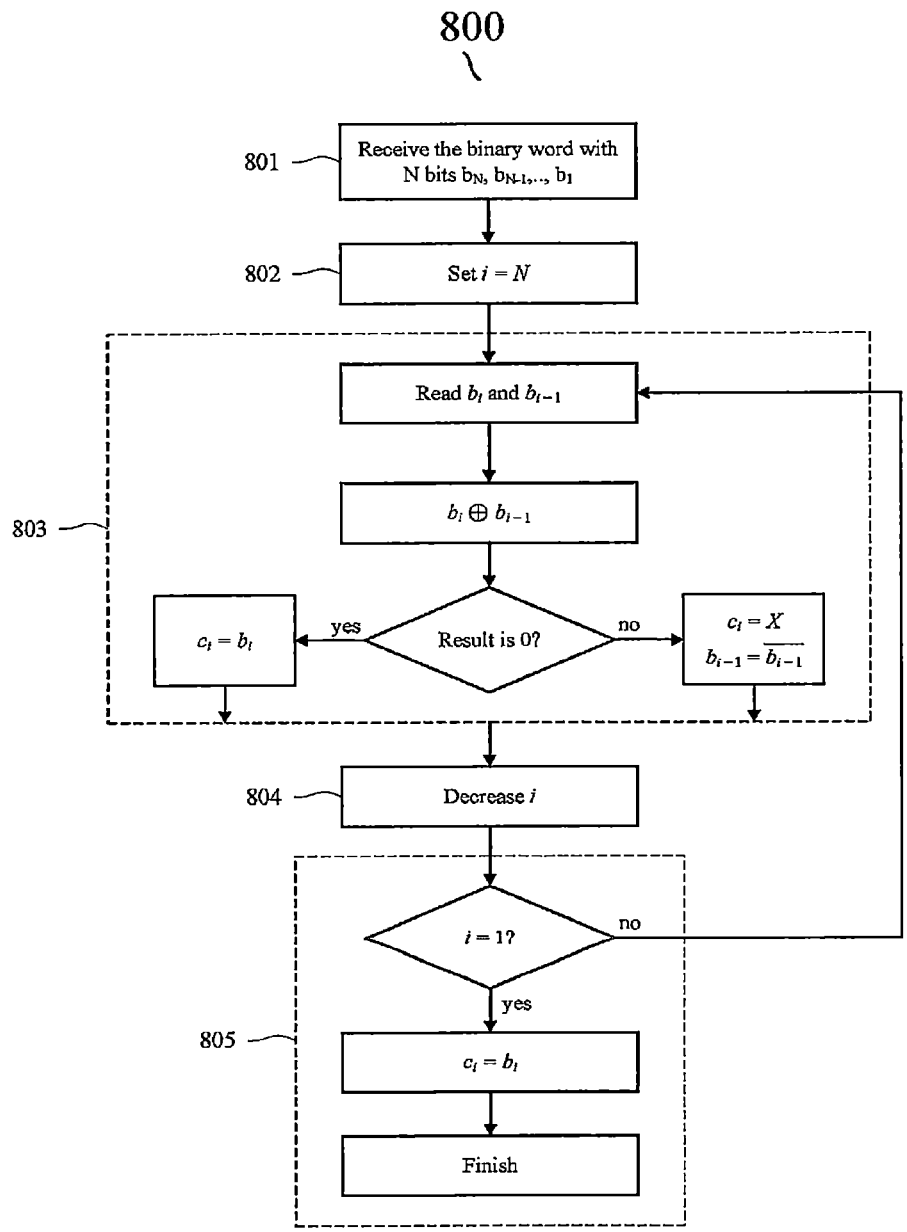
FIG. 8 is a block diagram that illustrates an example of a process flowchart embodiment for the algorithm that generates the information about the active signals and active cascade combiners in the digital combiner controller circuit of the digitally controlled multistage combiner with a cascade of combiners system.

Block diagram 800 of FIG. 8 is an example that illustrates an exemplary embodiment of the algorithm employed to generate the digital activation and deactivation information in block 209 of the embodiment of FIG. 2. A digital combiner controller circuit that employs an algorithm receives a binary word with N bits $b_N, b_{N-1}, \ldots, b_1$ that result from mapping the discrete values of amplitude and phases of the N input signals into a binary mapping table and generates a binary word with N bits $c_N, c_{N-1}, \ldots, c_1$ with the information about which components should be active in the combination process and includes the following steps:

1) in the first step 801, it receives binary word with N bits $b_N, b_N, \ldots, b_1$ that results from the quantization mapping process;
2) second step 802 defines the start from the most significative bit (that corresponds to the component with the highest power), i.e., set i=N;
3) third step 803 computes $b_i \oplus b_{i-1}$: XOR operation between $b_i$ and $b_{i-1}$, and depending on the result performs one of the following actions:
   a. If the result is 0, $c_i = b_i$.
   b. If the result is 1, $c_i = X$ and $b_{i-1}$ is inverted.
4) in the fourth step 804, the value of i is decreased.
5) the fifth step 805 tests if i=1? and depending on the result performs one of the following actions:
   a. Yes: $c_i = b_i$, Finish.
   b. No: Go to step 803.

The digital information about the deactivated signals $c_N, c_{N-1}, \ldots, c_1$ can be stored in a LUT. The control information to deactivate combiners and the info to control the switches can be computed using $c_N, c_{N-1}, \ldots, c_1$. In another embodiment the algorithm can receive a matrix with size $N_s \times N$ with the binary words associated to the quantization of $N_s$ samples of the signal envelope.

Figure 9:
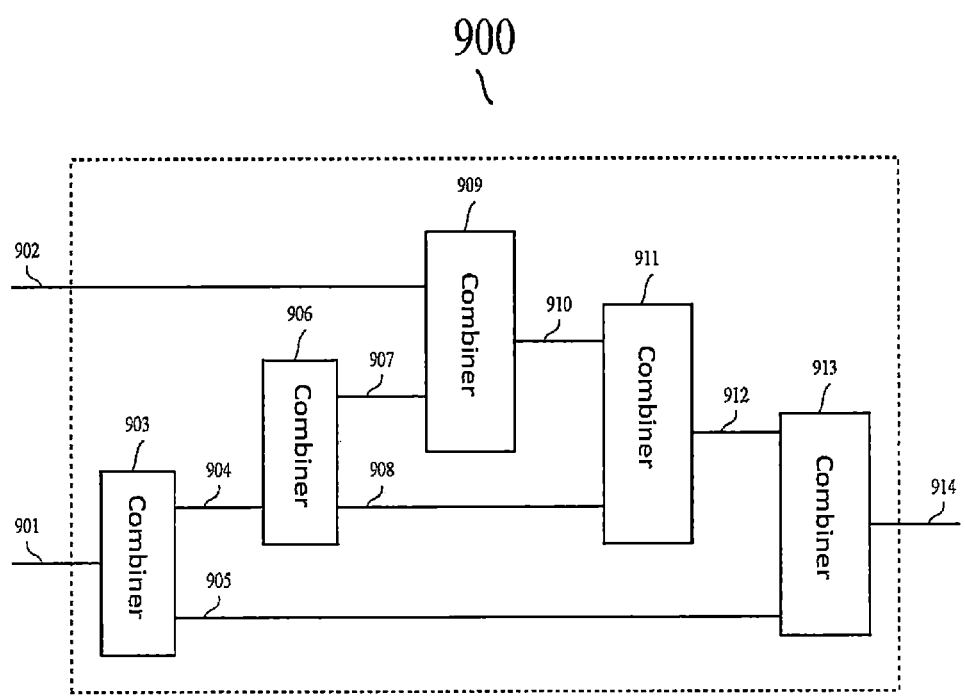
FIG. 9 is a block diagram that illustrates an exemplary embodiment of a combiner implemented as a cascade of splitters followed by a cascade of combiners.

As mentioned before in other embodiments, some of the power combiners may be implemented by a cascade of splitters followed by a cascade of combiners to reduce the power difference between the inputs of these combiners. Block diagram of FIG. 9 is an example of an embodiment of the implementation of one power combiner of the cascade structure implemented as a cascade of splitters followed by a cascade of combiners. For illustration purposes and not limitation, it can be assumed that 901 is a signal with power 4P and 902 is a signal with power P. In 903 the power of signal 901 is split into two signals 904 and 905 with power 2P. Signal 904 is the input of a second splitter 906 that splits this signal into two signals 907 and 908 with power P. The resulting signal 907 is combined with 902 in combiner 909. The next combiner 911 is employed to combine the output of first combiner 910 with signal 908 and the third combiner 913 combines the output of second combiner 912 with signal 905 in the signal 914. It is important to mention that the use of two splitters and three combiners in the embodiment of FIG. 9, is only for illustration purposes and not limitation. Other number of splitters and combiners can be used in cascade to implement one or more combiners of the digitally controlled lossless multistage combiner with multiple cascade combiners.

The scope of the invention covers the use of other discrete phase alphabet sizes, and implementations of such variations will be apparent to persons skilled in the art based on the teachings contained herein.

While various embodiments of the present invention have been described above, it should be understood that they have been presented by way of example only, and not limitation. Thus, the breadth and scope of the present invention should not be limited by any of the above-described exemplary embodiments but should be defined only in accordance with the following claims and their equivalents. Various variations and modifications may be made without departing from the scope of the present disclosure. It should be understood by those skilled in the art that various modifications, combinations, sub-combinations and alterations may occur depending on design requirements and other factors insofar as they are within the scope of the appended claims or the equivalents thereof.

Furthermore, the blend of various techniques and circuits provided in the disclosure provide unique aspects of the invention which permits superior linearity, power added efficiency, monolithic implementation and low cost. Embodiments of the invention can be implemented by a blend of hardware, software and firmware. Both digital and analog techniques can be used with or without microprocessors, FPGA (Field Programmable Gate Arrays) and DSP's (digital signal processors).

Embodiments of the invention can be implemented for communications systems and electronics in general. In addition, and without limitation, mechanics, electro mechanics, electro optics, and fluid mechanics can make use of the same principles for efficiently amplifying and combining signals.

What is claimed is:

1. A method for a digitally controlled multistage combiner with a cascade of combiners, comprising:
   receiving a plurality of inputs with samples of N RF (radio frequency) or N IF (intermediate frequency) input signals, where N denotes the number of input signals, each of the inputs having respective amplitude and discrete phases belonging to a finite alphabet of phase values;
   receiving a plurality of inputs with information about a discrete phase and amplitude of N baseband input signals, each of inputs having the information of the amplitude and discrete phase value belonging to the finite alphabet;

receiving a clock signal in accordance with a sampling rate applied to the N baseband input signals;

receiving a clock signal according to signal frequency of the N IF input signals;

receiving a clock signal in accordance with a desired output RF signal frequency;

receiving a power control information needed to adjust output power of each of N power amplifiers (PAs);

processing amplitudes and phases of the N input sample signals to generate N drive signals for the N power amplifiers and N control signals to control phases of the signals at the power amplifiers inputs and outputs and to generate a binary mapping table;

processing the binary mapping table to generate digital control signals that control sets of switches that activate and deactivate the inputs, bypasses and outputs of each combiner in a cascade structure, wherein the digital control signals are generated according to an iterative algorithm that selects and activates in-phase signals to be combined;

processing the binary mapping table to generate digital control signals needed, to control the set of switches that activate and deactivate the outputs of the N power amplifiers, wherein the switches are related to the activation and deactivation of inputs and the bypasses of the cascade combiners and the switches that activate and deactivate the outputs of the cascade combiners;

processing in a digital switch control information about activation and deactivation to activate or deactivate drive signals and change signal phases according to the control information;

changing phases of the active signals according to the information provided by the digital switch control information;

processing the N input signals by multiplying these signals by a periodic pulse signal with the desired output signal frequency;

activating and deactivating the switches that control the combiners inputs, bypasses and outputs according to the activation and deactivation digital information on the cascade combiners, where each combiner has two inputs, and where each combiner is electrically and selectively connected by using the switches to the previous and next combiner stage in the cascade structure;

amplifying each of the active signals that will be active in the combination process; and processing outputs of the active amplifiers and combining them in the multistage cascade combiner structure according to the digital control signals that define which signals are active in the power combination process.

2. The method according to claim 1, wherein said step of receiving said input signal carrying information bits comprises:

receiving samples of N band limited signals or receiving samples of N in-phase and quadrature phase components of N band limited signals.

3. The method according to claim 1, wherein said number of quantization bits of the samples of said N input signals is the same as the number of said N input signals.

4. The method according to claim 1, further comprising a filter after the output of cascade of combiners to perform a spectral shaping of said desired output signal.

5. The method according to claim 1, further comprising said second set of digital control signals to control the power supply voltage and the current to be applied in each Power amplifier to vary the output power of each branch.

6. The method according to claim 1, further including:

sampling the N input signals in accordance with the said sampling rate.

7. An apparatus for digitally controlled multistage combiner with a cascade of combiners, comprising:

an input circuitry that receives samples of N RF (radio frequency) or samples of N IF (intermediate frequency) input signals, where N denotes the number of input signals, with each of the inputs having a respective amplitude and discrete phases belonging to a finite alphabet of phase values;

an input circuitry that receives N baseband input signals, with each of the inputs having information of the amplitude and a discrete phase value belonging to a finite alphabet of M possible phase values, being M the alphabet size;

an input circuitry that receives a clock signal in accordance with a sampling rate applied to the N input signals;

an input circuitry that receives a clock signal according to a signal frequency of the N IF signals;

an input circuitry that receives a clock signal in accordance with a desired output RF signal frequency;

an input circuitry that receives a power control information needed to adjust the output power of each power amplifier (PA);

a digital phase and drive amplifier controller circuitry that receives the N input signals with N different amplitudes and phases belonging to a finite and discrete alphabet, that generates a mapping table and digital control signals to control drive signals of each PA of a set of N power amplifiers (PAs) in parallel, and controls the phases of the signals at power, amplifiers inputs and outputs;

a digital combiner controller circuitry that processes the mapping table to generate a digital switch control information needed to control the switches that activate and deactivate the outputs of the N PAs, the switches that activate and deactivate inputs of cascade combiners and switches that activate and deactivate the outputs of cascade combiners;

processing the digital switch control information in the digital phase and drive amplifier controller circuitry to activate or deactivate the drive signals of the PAs and change the signal phases according to the control information;

changing the phases of the active signals according to the information provided by the digital combiner controller circuitry;

processing the N input signals by multiplying these signals by a periodic pulse signal with the desired output RF signal frequency;

activating and deactivating switches that control the combiners inputs, bypasses and outputs according to the activation and deactivation digital information on a cascade of signal combiners, where each one has two active inputs, wherein each combiner is electrically and selectively connected by switches to the previous and next stage combiners in the cascade combiner structure;

amplifying each of one of the active input signals that will be active in the combination process; and processing the outputs of the active power amplifiers and combining them in the cascade combiner structure, according with the digital control information that defines which signals are active in the power combination process.

8. The apparatus of claim 7, wherein:
a digital control circuitry controls sets of switches that activate and deactivate inputs and outputs of each combiner in the cascade combiner structure and the digital control information signals are generated according to an iterative algorithm that selects and activates the in-phase signals to be combined.

9. The apparatus of claim 7, wherein:
a first set of switches activate and deactivate the outputs of the N PAs according to the control information provided by the digital combiner controller circuitry and the digital phase and drive amplifier controller circuitry;
an optional set of switches connected to the outputs of cascade combiners, that activate and deactivate the direct connection of each output to the output of the cascade combiner structure;
a third set of switches that selects which inputs are activated in each power combiner of the cascade combiner structure;
a plurality of cascade signal combiners where each combiner inputs are activated according to the digital control information that controls the 3 sets of switches, and that is provided by digital combiner controller circuitry and the digital phase and drive amplifier controller circuitry.

10. The apparatus of claim 7, wherein:
each power combiner in the cascade combiner structure can be implemented as a cascade of power splitters followed by a cascade of power combiners, being the inputs and the outputs electrically and selectively connected by the digitally controlled switches.

11. The apparatus of claim 7, wherein:
each combiner in the cascade structure can be activated or deactivated by sets of switches, being the inputs and the outputs electrically and selectively connected by the digitally controlled switches.

12. The apparatus of claim 7, wherein:
each combiner in the cascade structure has a minimum of 2 inputs, being the inputs electrically and selectively activated by the digitally controlled switches.

13. The apparatus of claim 7, wherein the respective impedances of the inputs of the combiners are determined as a function of the active inputs and the digital control signals.

14. The apparatus of claim 7, wherein:
the digital phase and drive amplifier controller circuitry stores the samples of the input signals in a buffer and processes the samples of the N received signals according to the clock signal with the sampling rate and maps the discrete values of amplitude and phases of the N input signals to generate a binary mapping table that may be stored in a look up table or memory buffer, and generates N drive signals for the N PAs and the digital control signals needed to control them;
the binary mapping table is provided to the digital combiner controller circuitry to generate the digital control signals needed to control the switches that activate and deactivate the outputs of the N amplifiers, the switches that activate and deactivate of inputs of the N−1 cascade combiners and the switches that activate and deactivate the outputs of the N−1 cascade combiners.

15. The apparatus of claim 7, further including:
a digital combiner controller circuitry that uses an algorithm wherein the phases and amplitudes of the inputs of PAs are compared to generate the digital switch control information that controls the switches that activate and deactivate the outputs of PAs, activate and deactivate the inputs of each cascade combiner, and activate and deactivate the outputs of cascade combiners and controls the phase shift information needed by the digital phase and drive signal amplifier controller to ensure that the signals combined in any combiner are in-phase;
digital switch control information with control information about the deactivated signals, the deactivated combiners, and the activation and deactivation of drive signals and the changes on the signals phases submitted to the active amplifiers.

16. The apparatus of claim 7, wherein:
the digital switch control information includes a set of digital control signals used to control the switches that activate or deactivate the outputs of each PA as inputs of the cascade combiners, and a set of digital control signals that controls the set of switches that activate or deactivate the direct outputs of the cascade combiners and activate or deactivate the direct output of the corresponding combiner or as input to the other cascade combiners.

17. The apparatus of claim 7, wherein:
the digital combiner controller circuit employs an algorithm that receives a binary word with N bits $b_N, b_{N-1}, \ldots, b_1$ that results from mapping the discrete values of amplitude and phases of the N input signals into a binary mapping table and generates a binary word with N bits $c_N, c_{N-1}, \ldots, c_1$ with the information about which components should be active in the combination process and includes the following steps:
1) In the first step, it receives a binary word with N bits $b_N, b_{N-1}, \ldots, b_1$ that result from mapping the discrete values of amplitude and phases of the N input signals into a binary mapping table;
2) Second step defines the start from the most significative bit (that corresponds to the component with highest power), i.e., set i=N,
3) Third step computes $b_i \oplus b_{i-1}$: XOR operation between bland 1314 and depending on the result performs one of the following actions:
  a. If the result is 0, $c_i = b_i$;
  b. If the result is 1, $c_i = X$ and $b_{i-1}$ is inverted;
4) in the fourth step, the value of i is decreased;
5) The fifth step tests if i=1? and depending on the result performs one of the following actions:
  a. yes: $c_i = b_i$ finish;
  b. no: go to step 3.

18. The apparatus of claim 7, wherein said received N input signals by input circuitry comprises: receiving the N signals from which can be decomposed a quantized version of a band limited information signal with time-varying envelope or receiving N signals from which can be decomposed a quantized version the in-phase and quadrature phase components of one band limited information signal with time-varying envelope or receiving the samples of N signals from which can be decomposed a quantized version of the in-phase and quadrature components of one information band limited signal with time-varying envelope or comprises receiving the samples of one information band limited signal with time-varying envelope.

19. The apparatus of claim 7, further comprising a biasing control circuitry coupled to the N power amplifiers, wherein said supply and biasing control circuitry operates according to power control information received as input and digital switch control information and digital drive control information to control power supply voltage and current affecting each power amplifier in each branch.

20. The apparatus of claim 7, further comprising:
a bandpass filter coupled to each power amplifier to filter each signal according to a desired spectral mask for the output signal.

21. The apparatus of claim 7, wherein said digital combiner circuitry and digital phase and drive amplifier controller circuitry can be implemented in a unique circuitry comprising one or more look up tables which are used to set of digital control signals.

22. The apparatus of claim 7, wherein said digital combiner circuitry and digital phase and drive amplifier controller circuitry can be implemented by hardware or software using digital signal processors or field programmable gate arrays.

23. The apparatus of claim 7, wherein each PA comprises one or more amplification sub-stages with one or more transistors.

24. The apparatus of claim 7, wherein said N PAs comprise a plurality of current source power amplifiers or a plurality of switched power amplifiers.

25. The apparatus of claim 7, wherein said ratios between power amplifiers' outputs can be 2, 4 or other ratio according to the total power needed at output and the number of PAs.

* * * * *